United States Patent [19]
Levy

[11] Patent Number: 4,968,959
[45] Date of Patent: Nov. 6, 1990

[54] MICROWAVE FREQUENCY DIVIDER

[75] Inventor: Philippe Levy, Chateau-Thierry, France

[73] Assignee: Alcatel N.V., Amsterdam, Netherlands

[21] Appl. No.: 410,326

[22] Filed: Sep. 21, 1989

[30] Foreign Application Priority Data

Sep. 22, 1988 [FR] France .................... 88 12383

[51] Int. Cl.⁵ .................... H03B 19/00; H02M 5/293; H02M 5/297
[52] U.S. Cl. .................... 333/218; 333/246
[58] Field of Search ............... 333/218, 246; 363/159, 363/163

[56] References Cited

U.S. PATENT DOCUMENTS 4,631,500 12/1986 Rauscher .................... 333/218 X
4,845,389 7/1989 Pyndiah et al. .................... 333/218 X

FOREIGN PATENT DOCUMENTS 0025894 4/1981 European Pat. Off. .

OTHER PUBLICATIONS

NEC Electronics (Europe) GmbH; Preliminary Data Sheet for NPN Silicon High Frequency Transistor NE681 (4 pages).
"Regenerative Frequency Division with a GaAs FET", IEEE Transactions on Microwave Theory & Techniques, vol. MIT-32, No. 11, Nov. 1984, C. Rauscher.
"A Microwave Frequency Halver with Conversion Gain", S. P. Stapleton et al., Conference Proceedings of the 16th European Microwave Conf., Dublin, Sep. 8, 1986.
"20 GHz Frequency-Divider Silicon Bipolar MMIC", Electronic Letters, vol. 23, No. 20, Sep. 24, 1987, pp. 1085-1087, Stevenage, Hertz, GB.

Primary Examiner—Paul Gensler
Attorney, Agent, or Firm—Christie, Parker & Hale

[57] ABSTRACT

An analog type of microwave frequency divider for dividing frequency by two. It comprises a common emitter transistor (8) and a feedback loop comprising a filter (9, 11) and a phase-adjusting inductor (12). The filter (9, 11) is tuned to half the input frequency (fe/2) and the transistor (8) operates in its non-linear region. The two inductors (11, 12) are made of microstrip. The divider also includes an output matching filter comprising a capacitance (14) and two inductors (15, 16) which are likewise both made of microstrip.

5 Claims, 1 Drawing Sheet

MICROWAVE FREQUENCY DIVIDER

The present invention relates to a frequency halver (divide-by-two) circuit for use with microwave frequencies.

Frequency dividers usable at microwave frequencies include logic dividers and analog dividers.

High speed logic dividers which are generally monolithic components made of silicon or of gallium arsenide suffer from the drawbacks of being expensive and sensitive to supply voltages, and of suffering non-negligible temperature drift.

Analog dividers based on varactor diodes or on fast-switching diodes suffer from the need for relatively high input powers, generally greater than 30 milliwatts, of covering a relatively narrow band, and of a small dynamic range on input since the variations in input level which are possible are relatively limited. In addition, these dividers must be placed in a milled box specific thereto.

In some cases it is possible to make use of a synchronized subharmonic oscillator, but the permanent presence of an output signal which is free in frequency can disturb proper operation of equipment in which it is inserted.

The invention seeks to remedy these drawbacks. To this end the invention provides a frequency halver circuit for microwaves, constituting a divider of the analog type. This frequency divider comprises a transistor connected as an amplifier, having its operating point situated in the non-linear portion of its characteristic. Its input circuit (base or gate) includes two strip inductors known as "microstrips" with the first inductor being connected in series between the microwave signal input terminal and the base or gate (control electrode) of the transistor, and with the second inductor being adjustable and connected in parallel between said input terminal and ground. The first inductor is provided to cooperate with the stray capacitance between the control electrode and the output electrode of the transistor to define a selective feedback loop whose filter frequency is adjusted to one-half of the input frequency. The second inductor is adjusted so that the phase of the signal reinjected by the above-mentioned feedback loop is such that said reinjected signal is subtracted from the input signal.

Advantageously, an output matching filter is placed in the output circuit of the transistor, with the filter being adjusted to one-half of the frequency of the input signal. The output filter is advantageously a bandpass filter centered on said half frequency and having a bandwidth sufficient to cover about one octave. It is preferably constituted by a capacitance connected between the output electrode of the transistor and ground, together with two inductors constituted by microstrip and comprising:

a first inductor connected between said output electrode and the microwave output terminal of the divider; and a second inductor connected between said output terminal and ground.

In any event, the invention will be well understood and its advantages and other characteristics appear on reading the following description of a non-limiting embodiment made with reference to the accompanying diagrammatic drawing, in which:

FIG. 1 is a block diagram of a frequency halver circuit which is conventional in structure and whose generating operating principle is used in implementing the invention.

Figure 1:
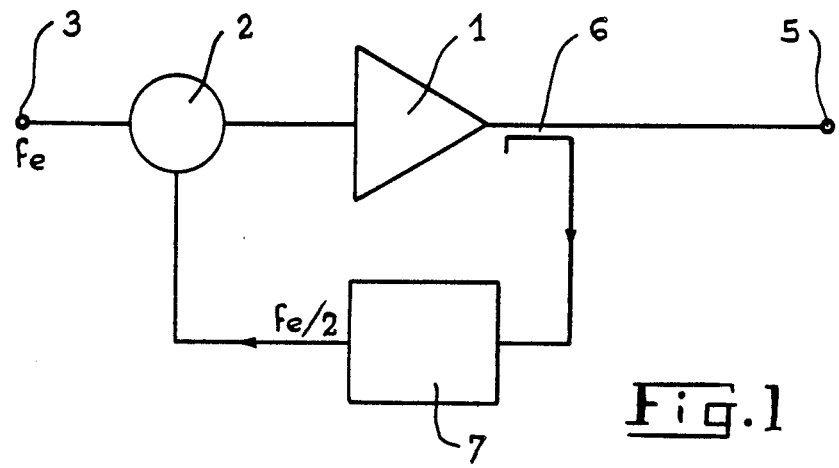
FIG. 1 is a block diagram of the principle on which the frequency divider is based.

In this figure, reference 1 designates a high gain amplifier including a filter tuned to half the frequency of the input signal. This amplifier is fed with the input signal at a frequency fe (via input terminal 3) and via an adder 2. The output signal from the amplifier 1 feeds the output terminal 5 of the frequency divider.

A coupler 6 is also connected to the output of the amplifier 1 and constitutes the input to a feedback loop including a circuit 7 which constitutes both a highly selective filter tuned to the frequency fe/2, and an adjustable phase shifter circuit.

A signal is thus obtained at the output of the circuit 7 at a frequency fe/2 and this signal is applied to the adder 2 with a phase shift which is adjusted to the value $\pi$.

Figure 2:
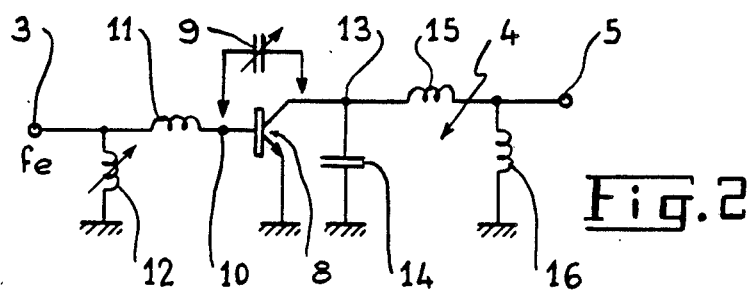
FIG. 2 is a circuit diagram of the frequency divider.

This circuit constitutes a feedback loop frequency divider and its general principle, which is conventional, is used in the microwave divider of the invention as shown in FIG. 2 to which reference is now made.

This circuit includes a consumer microwave type of bipolar transistor 8 such as that commercially available from NEC Electronics under the reference NE 64535. This transistor is connected in a common emitter configuration. It has collector-base stray capacitance 9 whose value varies as a function of the instantaneous amplitude of the input microwave signal at frequency fe as applied to input terminal 3.

A first inductor 11 made of microstrip is connected between the terminal 3 and the base 10 of the transistor 8. In combination with the stray capacitance 9, this inductor forms a selective feedback loop filter which is tuned to the half frequency fe/2. A second inductor 12, also made of microstrip, is connected between the terminal 3 and ground. This inductor 12 serves to adjust the phase of the feedback signal in order to make it equal to $\pi$ as for the circuit shown in FIG. 1. The transistor 8 is biased and loaded so that its operating point lies in the non-linear (parabolic) region of its base-emitter, $I_B - V_{BE}$ characteristic, in which $I_B$ is the base current and $V_{BE}$ is the base-emitter voltage. The two intermodulation products at frequencies fe+fe/2 and fe−fe/2 therefore appear at its output and these are reinjected to the input 3 of the high gain amplifier constituted by the transistor 8 via the adjustable filter which is constituted by the stray capacitance 9 and the inductor 11. Since the pass frequency of this filter is tuned to fe/2, it follows that this is the only component that it allows to pass therethrough, such that given the return phase is adjusted to $\pi$ by adjusting the inductor 12, the FIG. 2 circuit is substantially the same as the very simple theoretical circuit of FIG. 1 in which circuits 6 and 7 are replaced by reactive components 9, 11, and 12.

Finally, a signal at frequency fe/2 appears on the output terminal 13 of the transistor 8. In order to obtain only the signal at frequency fe/2 at the output 5, a filter 4 centered on fe/2 is inserted between the terminals 13 and 5. This filter 4 comprises a capacitance 14 connected between the collector of the transistor B and ground, and implemented in the form of a discrete component, and two inductors 15 and 16 implemented in the form of microstrip, with one of the inductors 15 being connected between the terminals 13 and 5 and the other inductor 16 being connected between the terminal 5 and ground.

The filter 4 is advantageously a bandpass filter which, although centered on the frequency fe/2, is designed to have sufficient bandwidth to enable it to cover an octave.

Figure 3:
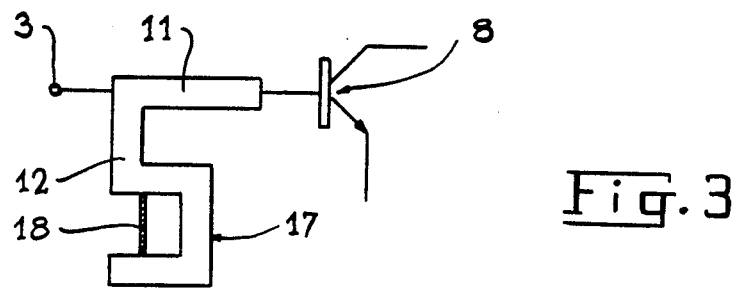
FIG. 3 shows how the two inductors in the input circuit of the transistor used in the frequency divider are made and adjusted.

FIG. 3 shows how the two input inductors 11 and 12 are made by means of a roughly S-shaped microstrip 17.

The inductor 11 is constituted by the top horizontal arm of the S-shape, whereas the inductor 12 is constituted by the remainder thereof and its value is adjusted (in order to obtain a phase shift equal to $\pi$) by means of a short circuit line 18 made of silver lacquer.

Naturally, the invention is not limited to the embodiment described above. For example, by means of an additional control transistor, it is possible to adjust the operating point by means of a current mirror, thereby enabling proper operation to be obtained over a range running from $-30°$ C. to $+60°$ C. This divider may be made in the same way using a field effect transistor, in which case the base of the transistor 8 is replaced by the gate of the FET, and the emitter and the collector of the transistor 8 are respectively replaced by the source and the drain of the FET.

I claim:

1. A microwave frequency divider for halving an input frequency of an associated input signal, the divider comprising a transistor connected as an amplifier having its operating points situated in the non-linear portion of its characteristic, and a transistor control circuit including two microstrip inductors formed from two adjacent portions of a single microstrip including at least one open jaw-shaped microstrip portion, wherein the first inductor is connected in series between the input terminal for the microwave signal and the control electrode of the transistor to thereby define, in combination with the stray capacitance between the control electrode and an output electrode of the transistor, a selective feedback loop whose filter frequency is tuned to half the input frequency, the second inductor includes said open jaw-shaped portion and a conductive line across said open jaw-shaped portion to thereby adjust the inductance of the second inductor, the second inductor is connected in parallel between said input terminal and ground, and the conductive line across the open jaw-shaped portion of the second inductor is adjusted so that the phase of the signal reinjected by the feedback loop is such that said reinjected signal is subtracted from the input signal.

2. A frequency divider according to claim 1, wherein the two inductors are constituted by means of a roughly S-shaped microstrip, with said first inductor formed from an upper portion of said S-shaped microstrip, and said second inductor formed from a lower portion of said S-shaped microstrip.

3. A frequency divider according to claim 1, further comprising an output matching filter which is tuned to half the frequency of the input signal.

4. A frequency divider according to claim 3, wherein the output matching filter has a bandwidth covering about one octave.

5. A frequency divider according to claim 3, wherein the output matching filter further comprises a capacitance connected between the output electrode of the transistor and ground, and by two inductors implemented in the form of a microstrip, in which:

a first one of the inductors is connected between said output electrode and the microwave output terminal of the divider; and the second inductor is connected between said output terminal and ground.

* * * * *